United States Patent [19]

Takaoka et al.

[11] 4,289,928
[45] Sep. 15, 1981

[54] TONE CONTROL ARRANGEMENT FOR USE IN SOUND REPRODUCING INSTRUMENTS

[75] Inventors: Saburo Takaoka; Ryozi Higashi, both of Tokyo, Japan

[73] Assignee: Pioneer Electronic Corporation, Tokyo, Japan

[21] Appl. No.: 817,649

[22] Filed: Jul. 21, 1977

[30] Foreign Application Priority Data

Jul. 23, 1976 [JP] Japan ................................. 51-87238

[51] Int. Cl.$^3$ ............................................ H04M 1/00
[52] U.S. Cl. ................................... 179/1 D; 333/28 T
[58] Field of Search ..................... 179/1 D; 333/28 T; 84/1.01, 1.24

[56] References Cited

U.S. PATENT DOCUMENTS

| | | | |
|---|---|---|---|
| 3,313,885 | 4/1967 | Aiken | 179/1 D |
| 3,729,693 | 4/1973 | Dolby | 179/151 X |
| 3,849,601 | 11/1974 | Goncharoff | 179/1 D |
| 3,875,334 | 4/1975 | Hilbert et al. | 179/1 D |
| 4,004,253 | 2/1977 | Takasaki et al. | 179/151 X |

Primary Examiner—Mark E. Nusbaum
Assistant Examiner—E. S. Kemeny
Attorney, Agent, or Firm—Sughrue, Mion, Zinn, Macpeak and Seas

[57] ABSTRACT

A tone control arrangement is disclosed which is suitable for use in various sound reproducing instruments and in which the signal-to-noise ratio of the reproduced sound can be improved by controlling the frequency response of the audible signal with a variable d.c. voltage source. Frequency response control by a single d.c. control voltage is achieved by connecting in series and in order a first mixer, passive circuit network having a signal transmission characteristic determined by the desired frequency response of the output sound signal to be reproduced, a multiplier and a second mixer. The inverting inputs of the first and second mixers both receive the output of the multiplier, while the non-inverting input of the first mixer receives the input audio signal. The non-inverting input of the second mixer receives either the output of the first mixer or the input audio signal. Finally, the second input to the multiplier is provided by a variable d.c. voltage source. Tone control is achieved through a single control member even in the case of multi-channel systems by either using a single potentiometer wiper in common as the second input to each of the multipliers in the respective channels, or by ganging together a plurality of potentiometer wipers for control by a single member.

17 Claims, 9 Drawing Figures

TONE CONTROL ARRANGEMENT FOR USE IN SOUND REPRODUCING INSTRUMENTS

BACKGROUND OF THE INVENTION

1. Field of the Invention

This invention relates to a tone control arrangement for use in sound reproducing instruments such as multi-channel audio amplifiers, record players, tape recorders, radio and television receivers, and more particularly to a novel tone control arrangement which can attain any desired tone control utilizing a variable d.c. control voltage.

2. Description of the Prior Art

Prior art tone control arrangements are generally arranged to control the frequency response of an audible sound signal to be reproduced by directly varying those frequency components of the sound signal which are to be cut off or passed by means of, e.g., a variable resistor included in a tone control circuit. However, the conventional tone control arrangements arranged directly to control those frequency components of the sound signal which are to be cut off or passed have the disadvantages that they have a tendency to be affected by surrounding noise signal components, particularly in the case where a relatively long signal transmission line such as a lead wire or a printed strip conductor is used to introduce an input audible sound signal to be directly frequency controlled into the tone control circuit, thereby lowering the signal-to-noise ratio of the reproduced sound. Furthermore, in a multi-channel audio amplifier system, they usually require separate tone adjusting means such as variable resistors for the respective channels.

SUMMARY OF THE INVENTION

It is therefore an object of the invention to provide a tone control arrangement which can improve the signal-to-noise ratio of the reproduced sound by controlling the frequency response of an audible sound signal to be reproduced utilizing a variable d.c. control voltage without being significantly affected by circumferential noise signal components even if any wiring is used to introduce the variable d.c. control voltage into the tone control circuit, and which can attain any desired tone control by only a single tone adjusting means even in a multi-channel audio amplifier system.

This object is achieved by a tone control arrangement comprising a first mixer constructed of a subtractor or an adder and having one input terminal to which is applied an input audible sound signal to be frequency controlled; a passive circuit network coupled to the output of the first mixer and constructed of a low, high or band pass filter or any combination thereof and which has a signal transmission characteristic determined by the desired frequency response of the output sound signal to be reproduced; a multiplier receiving the output of the passive circuit network and a variable d.c. control voltage source to multiply the output signal from the former with the variable d.c. control voltage from the latter, an output signal from the multiplier being applied to the other input terminal of the first mixer; and a second mixer constructed of a substractor or an adder and having one input terminal coupled to the output of the multiplier, said other input terminal coupled to the one input or the output terminal of the first mixer, and an output terminal coupled to the output terminal of the tone control arrangement.

DETAILED DESCRIPTION OF THE PREFERRED EMBODIMENTS

Figure 1:
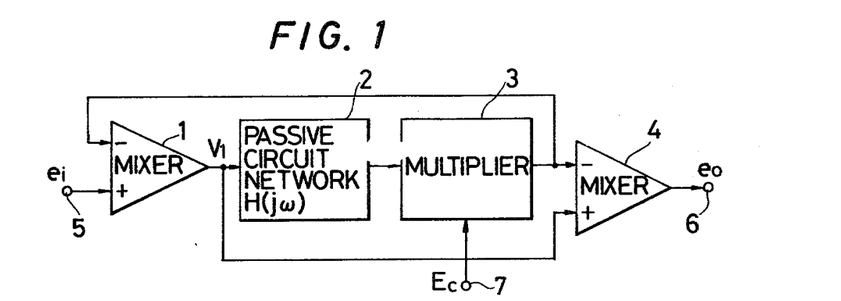
FIG. 1 shows a block diagram of a tone control arrangement according to one embodiment of the invention.

Referring to FIG. 1, reference numeral 1 denotes a first mixer constructed of, e.g., a subtracter and having a positive side input terminal 5 to which is applied an input audible sound signal $e_i$ to be frequency controlled. An output voltage $V_1$ from the mixer 1 is applied, together with a variable d.c. control voltage $E_c$ impressed on a terminal 7, to a multiplier 3 through a passive circuit network 2 having an amplitude transmission characteristic $H(j\omega)$ determined by the desired frequency response to the output sound signal $e_o$ to be reproduced. An output signal from the multiplier 3 is applied to a negative side input terminal of the mixer 1 and to a negative side input terminal of a second mixer 4 having a construction similar to the first mixer 1. Namely, the second mixer 4 has a positive side input terminal to which the output voltage $V_1$ of the first mixer 1 is applied and an output terminal connected to an output terminal 6 for the tone control arrangement.

The operation of the tone control arrangement of FIG. 1 will now be described with reference to FIG. 2.

Assuming that highest possible attenuation factor of the amplitude transmission characteristic $H(j\omega)$ of the passive circuit network 2 to be $Tm(j\omega)$, and the amplification factors of the first and second mixers 1 and 4 and of the multiplier 3 to be 1 respectively, then the amplitude transmission characteristic $H(j\omega)$ of the passive circuit network 2 is given by $$H(j\omega) = \frac{1 - Tm(j\omega)}{1 + Tm(j\omega)} \quad (1)$$

At this time, the transmission characteristic $H(j\omega)$ of the passive circuit network 2 is defined to satisfy the condition that the absolute value of the most attenuated amplitude transmission characteristic $Tm(j\omega)$ is less than 1, i.e., $|Tm(j\omega)| < 1$.

On the other hand, assuming an output voltage of the first mixer 1 to be $V_1$, the output voltage $V_1$ and an output voltage $e_o$ derived from the output terminal 6 of the tone control arrangement are respectively expressed as follows:

$$\{e_i - V_1 \cdot H(j\omega) \cdot E_c\} = V_1 \quad (2)$$

$$\{V_1 - V_1 \cdot H(j\omega) \cdot E_c\} = e_o \quad (3)$$

From the above equations (2) and (3), an input-output transmission characteristic $T(j\omega)$ for the tone control arrangement can be expressed by $$T(j\omega) = \frac{e_o}{e_i} = \frac{1 - H(j\omega) \cdot E_c}{1 + H(j\omega) \cdot E_c} \quad (4)$$

In th equation (4), assuming the absolute value of $H(j\omega) \cdot E_c$ or $E_c$ to be less than 1, i.e., $|H(j\omega) \cdot E_c| < 1$ or $|E_c| < 1$, the following equation stands:

$$\ln T(j\omega) = \ln \frac{1 - H(j\omega) \cdot E_c}{1 + H(j\omega) \cdot E_c} \quad (5)$$

When developing the right side of the above equation (5) and taking only the first term, then the following formula is obtained:

$$\ln T(j\omega) = E_c \cdot \ln \frac{1 - H(j\omega)}{1 + H(j\omega)} \quad (6)$$

Substituting the formula (6) into the equation (1), the following formula is obtained:

$$\ln T(j\omega) \approx E_c \cdot \ln Tm(j\omega) \quad (7)$$

Considering only the amplitude characteristic in the formula (7), the formula (7) can be expressed by $$\ln |T(j\omega)| \approx E_c \cdot \ln |Tm(j\omega)| \quad (8)$$

Figure 2:
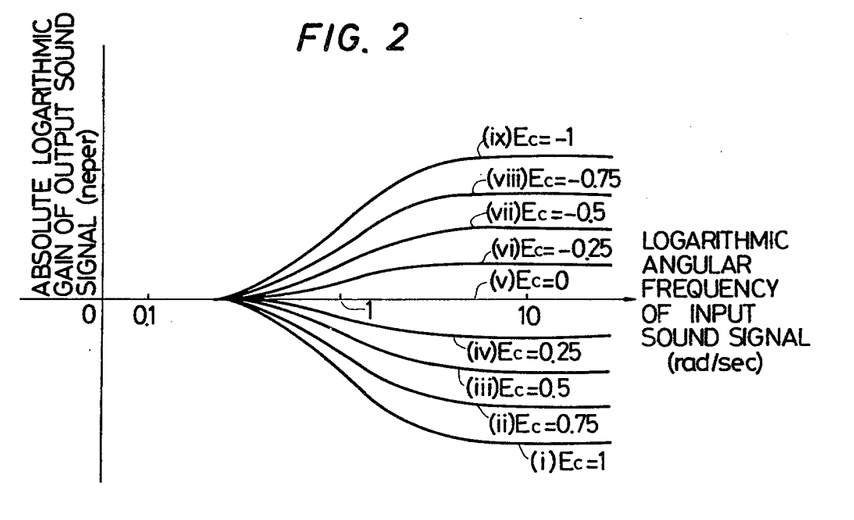
FIG. 2 shows a schematic curve diagram illustrating output frequency response characteristics of the circuitry of FIG. 1 where a d.c. control voltage $E_c$ is taken as a parameter.

As will be evident from the formulas (7) and (8) and FIG. 2 in which the abscissa indicates the logarithmic value of the angular frequency $\omega = 2\pi f$ of the input audible sound signal $e_i$ to be frequency controlled, i.e., log $\omega$(rad/sec), and the ordinate indicates the absolute logarithmic value of the input-output transmission characteristic $T(j\omega)$, i.e., $\log|T(j\omega)|$ (neper), the input-output transmission characteristic $T(j\omega)$ indicated by a logarithmic expression is proportional to the variable d.c. control voltage $E_c$ with respect to the most attenuated transmission characteristic $Tm(j\omega)$ defined by the amplitude transmission characteristic $H(j\omega)$ of the passive circuit network 2. For example, when the absolute logarithmic value $\log|Tm(j\omega)|$ of the most attenuated input-output transmission characteristic where the d.c. control voltage $E_c$ is 1 volt is chosen to have a value as shown by a curve (i) in FIG. 2 with respect to variations of the logarithmic angular frequency log $\omega$ of the input audible sound signal $e_i$, then the absolute logarithmic input-output transmission characteristics $\log|T(j\omega)|$ vary as shown by curves (ii) to (ix) in FIG. 2 with variations of the d.c. control voltage $E_c$ ranging between +1 volt and −1 volt.

As will be easily understood from the above description and FIG. 2, the tone control arrangement constructed as shown in FIG. 1 can vary the frequency response of an input audible sound signal $e_i$ to be frequency controlled and then to be reproduced over a wide range in response to variations of the d.c. control voltage $E_c$.

Figure 3:
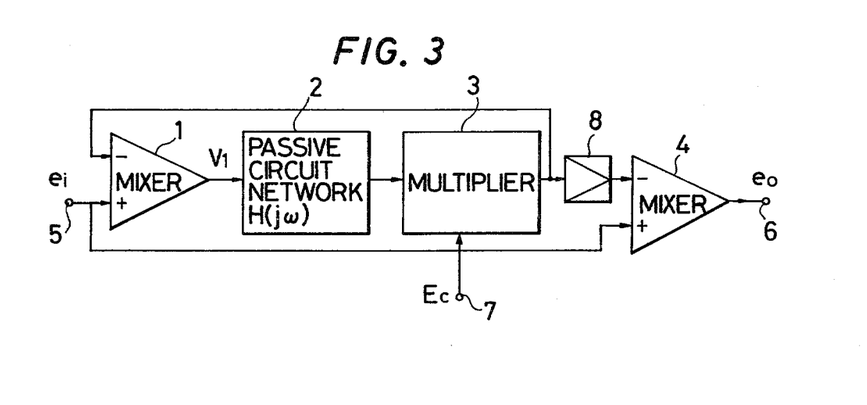
FIG. 3 shows a block diagram of a tone control arrangement according to another embodiment of the invention.

FIG. 3 shows a block diagram of a tone control arrangement according to another embodiment of the invention.

The embodiment of FIG. 3 has substantially the same construction as that of FIG. 1, excepting that an inverted amplifier 8 is provided between the output of the multiplier 3 and the negative side input terminal of the second mixer 4 and that the positive side input terminal thereof is connected to the positive side input terminal 5 of the first mixer 1 in place of the output terminal thereof in the embodiment of FIG. 1. Therefore, parts of FIG. 3 corresponding to those of FIG. 1 are designated by the same reference symbols and the description thereof is omitted.

In the embodiment of FIG. 3, assuming the amplification factor of the amplifier 2 to be 2, the following equations stand:

$$\{e_i - V_1 \cdot H(j\omega) \cdot E_c\} = V_1 \quad (9)$$

$$\{e_i - 2 \cdot V_1 \cdot H(j\omega) \cdot E_c\} = e_o \quad (10)$$

From the equations (9) and (10), the input-output transmission characteristic $T(j\omega)$ of the tone control arrangement is expressed by $$T(j\omega) = \frac{1 - H(j\omega) \cdot E_c}{1 + H(j\omega) \cdot E_c} \quad (11)$$

This equation (11) is the same as the above equation (4), and consequently it will be apparent that the tone control arrangement of FIG. 3 can so operate as to vary the frequency response of an input audible sound signal $e_i$ to be frequency controlled and then to be reproduced over a wide range in response to variations of the d.c. control voltage $E_c$ in the same manner as the tone control arrangement of FIG. 1.

Figure 4:
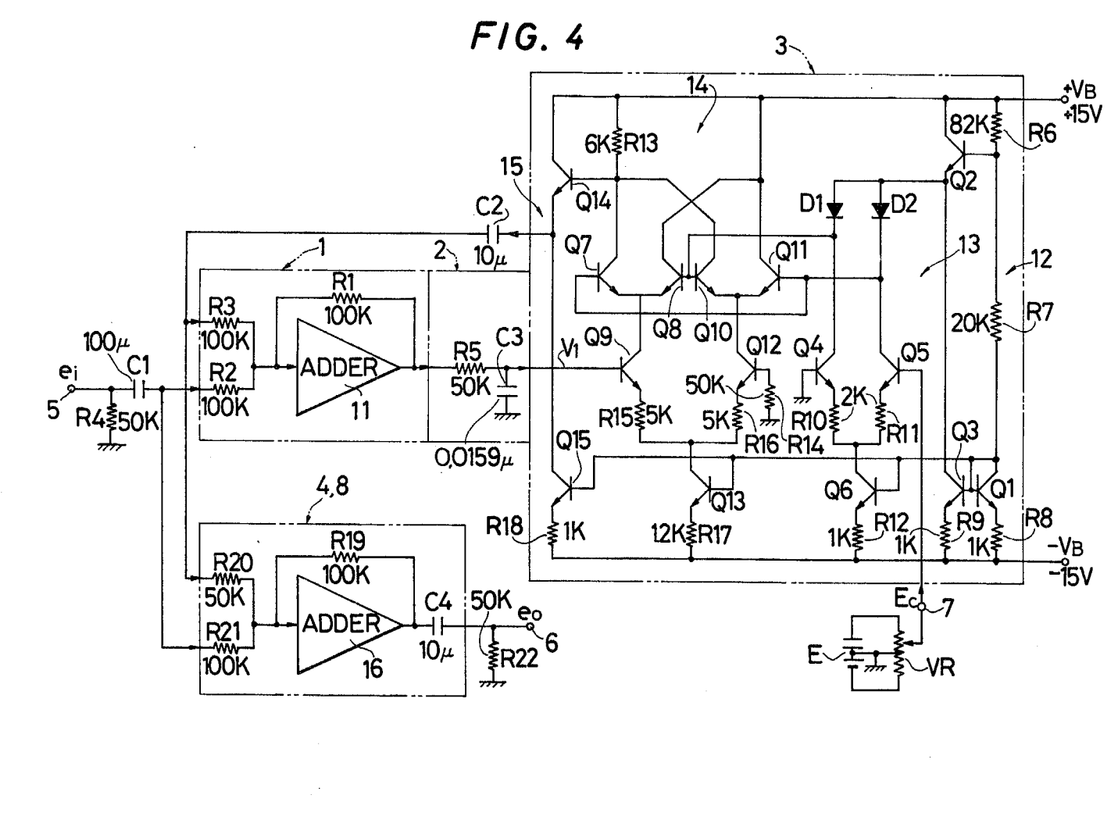
FIG. 4 shows a practical circuit diagram of a tone control arrangement constructed in accordance with the embodiment of FIG. 3.

FIG. 4 shows a practical circuit diagram of a tone control arrangement constructed in accordance with the embodiment of FIG. 3.

In FIG. 4, the first mixer 1 is comprised of an adder consisting of an inverted amplifier 11 and a negative feedback resistor R connected between the input and output terminals of the amplifier 11.

Applied to the input terminal of the adder are an input audible sound signal $e_i$ impressed on the terminal 5 and being frequency controlled via a series circuit consisting of a coupling capacitor C1 and a decoupling resistor R2, and an output signal from the multiplier 3 via a series circuit consisting of a coupling capacitor C2 and a decoupling resistor R3, the terminal 5 being connected via a resistor R4 to the ground. The two input signals to the adder are added to each other and amplified by an amplification factor of −1. This passive circuit network 2 comprises a integration circuit or a low pass filter consisting of a resistor R5 having one terminal connected to the output terminal of the adder 1 and a capacitor C3 connected between the other terminal of the resistor R5 and the ground. The multiplier 3 comprises a voltage divider section 12 connected between a first d.c. source terminal of a positive potential $+V_B$ and a second d.c. source terminal of a negative potential $-V_B$; an amplifier section 13 coupled to the voltage divider section 12 and amplifying the d.c. control voltage $E_c$ impressed on the terminal 7 through the slidable arm of a variable resistor VR having both ends connected across a d.c. voltage source E and a center tap connected to the ground; a multiplying section 14 coupled to the amplifier section 13 and the low pass filter 2; and an output amplifier section 15 coupled to the multiplying section 14. The voltage divider section 12 comprises a series circuit consisting of a resistor R6 having one end connected to the positive d.c. source terminal $+V_B$, a resistor R7 having one end connected to the other end of the resistor R6, the collector-emitter path of an NPN type transistor Q1 used as a diode and having a collector connected to its base and the other end of the resistor R7, and a resistor R8 having one end connected to the emitter of the transistor Q1 and the other end connected to the negative d.c. source terminal $-V_B$. The amplifier section 13 comprises an NPN type emitter follower transistor Q2 having a collector connected directly to the positive d.c. source terminal $+V_B$ and a base connected to the junction point between the resistors R6 and R7; an NPN type transistor Q3 having a collector connected to the emitter of the transistor Q2, a base connected to the base of the transistor Q1 and an emitter connected via a resistor R9 to the negative d.c. source terminal $-V_B$; a pair of NPN type transistors Q4 and Q5 jointly constituting a differential amplifier, and having their collectors connected via respective forward biased diodes D1, D2 in common to the emitter of the transistor Q2 and their emitters connected together via respective resistors R10, R11 and in turn connected to the negative d.c. source terminal $-V_B$ via a series circuit consisting of the collector-emitter path of an NPN type transistor Q6 and a resistor R12, the base of the transistor Q4 being connected to the ground and that of the transistor Q5 being connected to the terminal 7 to which the d.c. control voltage $E_c$ is applied. The multiplying section 14 includes double, balanced type differential amplifiers, one of which comprises a pair of NPN type transistors Q7 and Q8 having their emitters connected together and in turn connected to the collector of an NPN type transistor Q9 with its base connected to the output terminal of the low pass filter 2, the collector of the transistor Q7 being connected via a resistor R13 to the positive d.c. source terminal $+V_B$. The other differential amplifier comprises a pair of NPN type transistors Q10 and Q11 having their emitters connected together and in turn connected to the collector of an NPN type transistor Q12 with its base connected via a resistor R14 to the ground, the transistor Q10 having a collector connected to the collector of the transistor Q7 and a base connected, together with the base of the transistor Q8, to the collector of the transistor Q4 or the cathode of the diode D1, the transistor Q11 having a collector connected, together with the collector of the transistor Q8, to the positive d.c. source terminal $+V_B$ and a base connected, together with the base of the transistor Q7, to the collector of the transistor Q5 or the cathode of the diode D2, and the transistors Q9 and Q12 jointly comprising a differential amplifier and having their emitters connected together via respective resistors R15, R16 and in turn connected to the negative d.c. source terminal $-V_B$ via a series circuit consisting of the collector-emitter path of an NPN type transistor Q13 and a resistor R17. The output amplifier section 15 of the multiplier 3 comprises an NPN type emitter follower transistor Q14 having a collector connected directly to the positive d.c. source terminal $+V_B$ and a base connected to the collector of the transistor Q7; and an NPN type transistor Q15 having a collector connected to the emitter of the transistor Q14 and an emitter connected via a resistor R18 to the negative d.c. source terminal $-V_B$, the base of the transistor Q15 being connected, together with the base of the transistors Q6 and Q13, to the base of the transistor Q1.

And in FIG. 4, the second mixer 4 and the amplifier 8 are commonly constructed by an adder consisting of an inverted amplifier 16 and a negative feedback resistor R19 connected between the input and output terminals thereof. Connected to the input terminal of the adder 16 are the emitter of the transistor Q14 via a series circuit consisting of a decoupling resistor R20 and the coupling capacitor C2 and the terminal 5 to which is applied the input audible sound signal via a series circuit consisting of a decoupling resistor R21 and the coupling capacitor C1. The output terminal of the adder 16 is connected to the output terminal 6 of the tone control arrangement via a coupling capacitor C4, the output terminal 6 being connected via a load resistor R22 to the ground. In the embodiment of FIG. 4, typical values used for the respective resistors R1 to R22 and for the capacitors C1 to C4 are indicated in the figure.

The operation of the circuitry of FIG. 4 will be described hereinunder. Firstly, the variable d.c. control voltage $E_c$ impressed on the terminal 7 through the variable resistor VR from the d.c. voltage source E is amplified by the amplifier section 13 of the multiplier 3 and then multiplied, by the multiplying section 14 of the multiplier 3, with the output of the low pass filter 2 arranged to receive an output from the adder 11 to which are applied to add together an output from the multiplier 3 and the input audible sound signal $e_i$ impressed on the terminal 5 and which functions to amplify these two added input signals by an amplification factor of $-1$ by choosing the resistance of the resistor R3 equal to that of the resistor R2.

The multipled signal thus obtained, after being appropriately amplified by the output amplifying section 15 of the multiplier 3, is added by the adder 16 together with the input audible sound signal $e_i$ and then delivered on the terminal 6 as a desired tone controlled sound signal $e_o$.

At this time, the adder 16 is arranged to amplify the multiplied signal from the multiplying section 14 obtained through the output amplifying section 15 by an amplification factor of $-2$ but amplify the input audible sound signal $e_i$ by an amplification factor of $-1$, by choosing the resistance of the resistor R20 twice that of the resistor R21 in the embodiment of FIG. 4.

More precisely, assuming the output of the adder 11 to be $V_1$, the time constant of the low pass filter 2 consisting of the resistor R5 and the capacitor C3 to be $\tau$, and the amplification gain or factor of the multiplier 3 to be $A_3$, then the following equations stand:

$$e_i + V_1 \frac{1}{1 + j\omega\tau} A_3 E_c = -V_1 \tag{12}$$

$$e_i + 2V_1 \frac{1}{1 + j\omega\tau} A_3 E_c = -e_o \tag{13}$$

From the equations (12) and (13), $$T(j\omega) = \frac{e_o}{e_i} = \frac{1 - \frac{1}{1 + j\omega\tau} A_3 \cdot E_c}{1 + \frac{1}{1 + j\omega\tau} A_3 \cdot E_c} \tag{14}$$

Further, so separating the amplification factor $A_3$ of the multiplier into that $G_c$ of the output amplifying section 15 and total one $G_3$ of the remaining amplifying section 13 and multiplying section 14 as to obtain $A_3 = -G_3 \cdot G_c$ and assuming the maximum or saturated value of the variable d.c. control voltage $E_c$ to be Ecm, i.e., $G_c \cdot Ecm = 1$, then the above equation (14) is expressed by $$T(j\omega) = -\frac{1 - \frac{1}{1 + j\omega\tau} G_3, G_c, E_c}{1 + \frac{1}{1 + j\omega\tau} A_3, G_c, E_c} \quad (15)$$

In the equation (15), $$\frac{1}{1 + j\omega\tau} G_3 = H(j\omega)$$

Accordingly, the following equations are obtained:

$$T(j\omega) = -\frac{1 - H(j\omega) \cdot G_c E_c}{1 + H(j\omega) \cdot G_c E_c} \quad (16)$$

$$Tm(j\omega) = \frac{1 - H(j\omega)}{1 + H(j\omega)} = \frac{1 - G_3 + j\omega\tau}{1 + G_3 + j\omega\tau} \quad (17)$$

In the embodiment of FIG. 4, $G_c$ and $G_3$ are respectively chosen at 0.5 and 0.6, and consequently the following practical formulas stand:

$$Tm(j\omega) = \frac{0.4 + j\omega\tau}{1.6 + j\omega\tau} \quad (18)$$

$$\ln T(j\omega) = 0.5 E_c \ln -Tm(j\omega) \quad (19)$$

Figure 5:
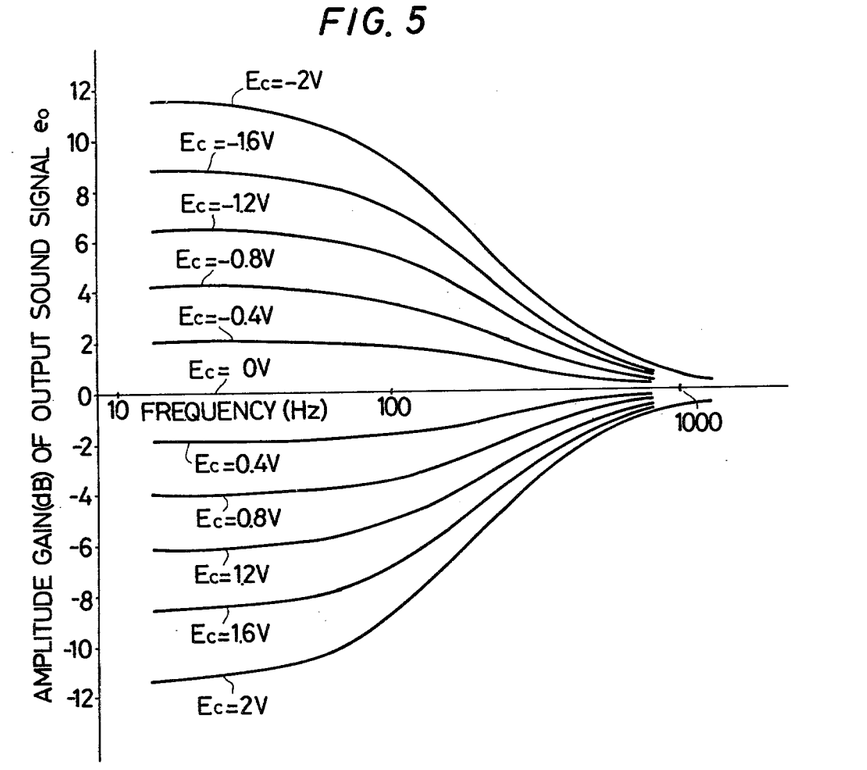
FIG. 5 shows a schematic curve diagram illustrating output frequency response characteristics of the circuitry of FIG. 4 similar to that of FIG. 2.

Thus if the time constant $\tau$ of the low pass filter 2 is equal to 795 $\mu$sec ($\tau$ = the resistance of the resistor R5·the capacitance of the capacitor C3 = 50·10³·0.01·59·10⁻⁶ sec = 795 $\mu$sec) as indicated in FIG. 4, then the input-output amplitude transmission characteristics $T(j\omega)$ representing the output frequency response characteristics of the tone control arrangement appearing on the terminal 6 vary, as shown in FIG. 5, with variations of the d.c. control voltage $E_c$ impressed on the terminal 7 from the d.c. voltage source E through the variable resistor VR.

In FIG. 5, the reason why the input-output amplitude transmission characteristics $T(j\omega)$ is not precisely proportional to variations of the d.c. control voltage $E_c$ is based on the fact that the formula (19) is the approximate one.

Figure 6:
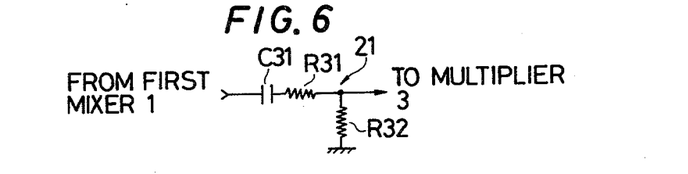
FIGS. 6 and 7 show different practical circuit diagrams of the passive circuit network 2 of FIG. 4.
Figure 7:
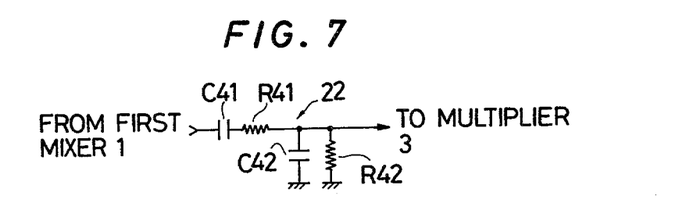

In the embodiment of FIG. 4, the passive circuit network 2 is constructed by the low pass filter consisting of the resistor R5 and the capacitor C3, but it may be constructed by a high pass filter 21, as shown in FIG. 6, (FIG. 2 corresponds to this case) which comprises, e.g., a series circuit consisting of a capacitor C31 and a resistor R31 connected between the output of the first mixer 1 and the input of the multiplier 3, and a resistor R32 connected between the input of the multiplier and the ground; or constructed by a band pass filter 22, as shown in FIG. 7, which comprises, e.g., a series circuit consisting of a capacitor C41 and a resistor R41 connected between the output of the first mixer 1 and the input of the multiplier 3, and a parallel circuit consisting of a capacitor C42 and a resistor R42 connected between the input of the multiplier 3 and the ground; or constructed by any combination of such low, high and band pass filters.

Figure 8:
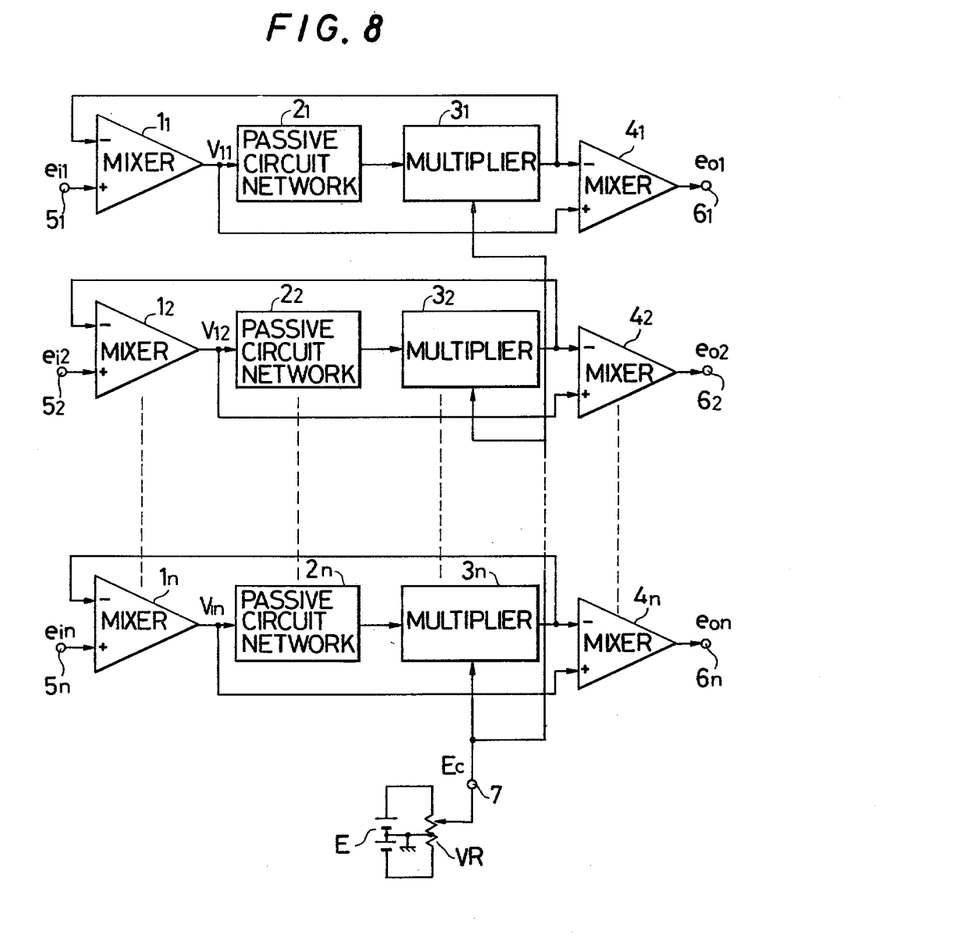
FIGS. 8 and 9 show block diagrams of tone control arrangements each constructed to suit for use in a multi-channel audio amplifier system according to the embodiment of FIG. 1.
Figure 9:
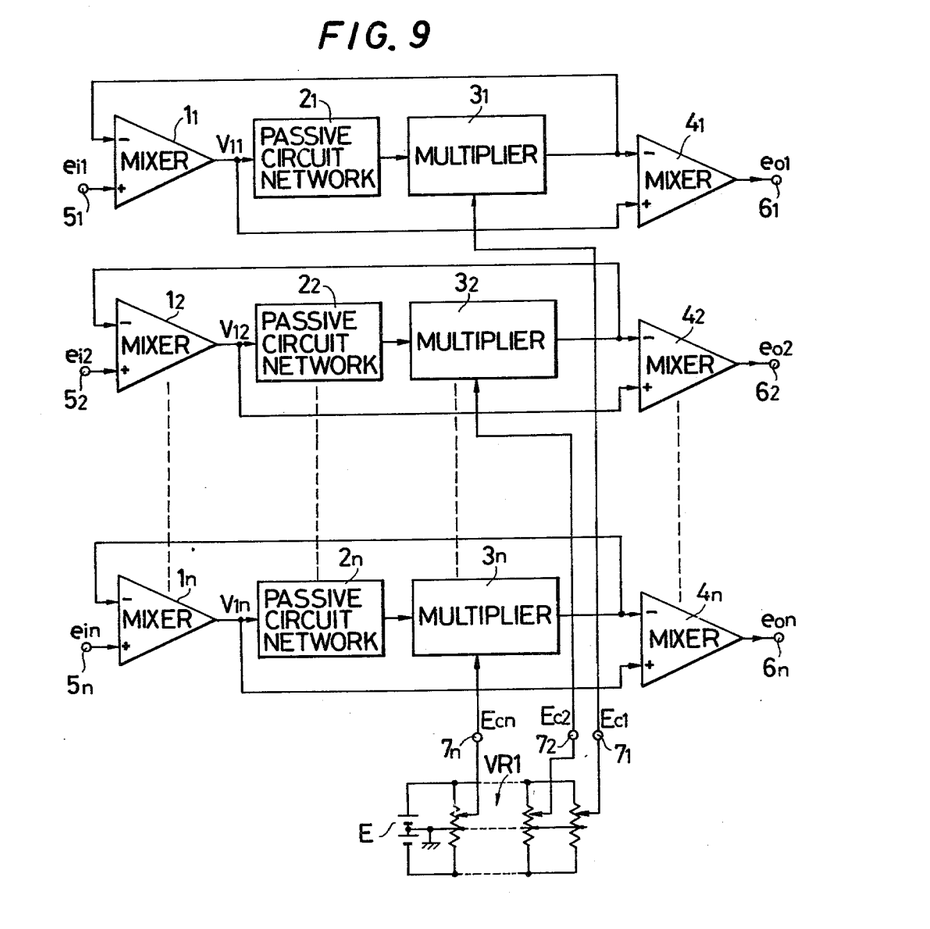

FIGS. 8 and 9 show schematic block diagrams of tone control arrangements each constructed to be suitable for use in a multi-channel audio amplifier system according to the embodiment of FIG. 1.

The tone control arrangements of FIGS. 8 and 9 each have the same construction as that of FIG. 1, excepting that the same number of tone control circuit units as the channel number of input audible sound signals $e_{i1}$, $e_{i2}$, ... $e_{in}$ to be reproduced are provided in parallel with one another, and in FIG. 8, the variable d.c. control voltage $E_c$ is used in common to the respective channels utilizing a single thrown-single contact type variable resistor VR as in the embodiment of FIG. 4, while in FIG. 9, separate variable d.c. control voltages $E_{c1}$, $E_{c2}$, ... $E_{cn}$ are used for the respective channels utilizing a single thrown-multicontact type variable resistor VR1.

Accordingly, parts of FIGS. 8 and 9 corresponding to those of FIG. 1 are denoted by the corresponding symbols and the description thereof is omitted.

As will be evident from the foregoing description, the tone control arrangement constructed in accordance with the invention is capable of providing more improvement in the signal-to-noise ratio of the reproduced sound than in the conventional tone control arrangement by controlling the frequency response of an audible sound signal to be reproduced utilizing a variable d.c. control voltage, and is capable of attaining any desired tone control by only a single tone adjusting means even in a multi-channel audio amplifier system.

It would be understood to those skilled in the art that the invention is not limited by only the preferred embodiments described herein but applicable to various variations and modifications common in their technical concept to the invention.

For example, the amplification factors of both the mixers 1, 4 and the multiplier 3 are not necessarily chosen at $-1$, respectively, but may be selected to have any desired value, and the relative locations between the passive circuit network 2 and the multiplier 3 may be changed, if desired.

What we claim is:

1. A tone control arrangement for use in sound reproducing instruments, said tone control arrangement including at least one tone control circuit unit comprising:
   a first mixer having a first input terminal to which is applied an audible sound signal to be frequency controlled and a second input terminal;
   a passive circuit network coupled to the output terminal of the first mixer and having an amplitude transmission characteristic determined by a desired frequency response of the tone control arrangement;
   a variable d.c. voltage source;
   a multiplier coupled to the passive circuit network and the variable d.c. voltage source to multiply an output signal derived from the former with a variable d.c. voltage from the latter, an output signal from the multiplier being applied to the second input terminal of the first mixer; and
   a second mixer having a first input terminal coupled to the output signal of the multiplier and a second input terminal coupled to the output terminal of the first mixer, said second mixer having
   an output terminal coupled to the output terminal of the tone control arrangement.

2. The tone control arrangement as claimed in claim 1, wherein the first and second mixers each comprise a subtractor.

3. The tone control arrangement as claimed in claim 1, wherein the first and second mixers each comprise an adder.

4. The tone control arrangement as claimed in claim 1, wherein the passive circuit network comprises a low pass filter.

5. The tone control arrangement as claimed in claim 1, wherein the passive circuit network comprises a high pass filter.

6. The tone control arrangement as claimed in claim 1, wherein the passive circuit network comprises a band pass filter.

7. The tone control arrangement as claimed in claim 1, wherein the variable d.c. voltage source comprises a fixed d.c. voltage source and a variable resistor having both ends connected across the fixed d.c. voltage source, a center tap connected to ground, and a slidable connected to the corresponding input terminal of the multiplier.

8. The tone control arrangement as claimed in claim 7, comprising a plurality of tone control circuit units for controlling the tone of a plurality of input audible sound signals and characterized in that a single variable resistor of a single thrown-single contact type is used having its slidable contact used in common as the slidable arm for each of the respective tone control circuit units.

9. The tone control arrangement as claimed in claim 7, comprising a plurality of tone control circuit units for controlling the tone of a plurality of input audible sound signals and characterized in that a single variable resistor of a single thrown-multicontact type is used having each of its slidable contacts used separately as the slidable arm for different ones of said tone control circuit units.

10. The tone control arrangement as claimed in claim 1, wherein the multiplier comprises an audio amplifier section coupled to the passive circuit network; a d.c. amplifier section coupled to the variable d.c. voltage source; a multiplying section coupled to the audio and d.c. amplifier sections; and an output amplifier section coupled between the multiplying section and the first and second mixers.

11. The tone control arrangement as claimed in claim 10, wherein the multiplying section includes double, balanced type differential amplifiers.

12. A tone control arrangement for use in sound reproducing instruments, said tone control arrangement including at least one tone control circuit unit comprising:

a first mixer having a first input terminal to which is applied an audible sound signal to be frequency controlled and a second input terminal;

a passive circuit network coupled to the output terminal of the first mixer and having an amplitude transmission characteristic determined by a desired frequency response of the tone control arrangement;

a variable d.c. voltage source;

a multiplier coupled to the passive circuit network and the variable d.c. voltage source to multiply an output signal derived from the former with a variable d.c. voltage from the latter, an output signal from the multiplier being applied to the second input terminal of the first mixer;

an inverter for receiving the output signal from said multiplier and providing an output signal; and a second mixer having a first input terminal coupled to the output signal of said inverter and a second input terminal coupled to the first input terminal of said first mixer, said second mixer having an output terminal coupled to the output terminal of the tone control arrangement.

13. The tone control arrangement as claimed in claim 12, wherein the variable d.c. voltage source comprises a fixed d.c. voltage source, and a variable resistor having both ends connected across the fixed d.c. voltage source, a center tap connected to ground, and a slidable contact connected to the corresponding input terminal of the multiplier.

14. The tone control arrangement as claimed in claim 12, comprising a plurality of tone control circuit units for controlling the tone f a plurality of input audible sound signals and characterized in that a single variable resistor of a single thrown-single contact type is used having its slidable contact used in common as the slidable arm for each of the respective tone control circuit units.

15. The tone control arrangement as claimed in claim 12, comprising a plurality of tone control circuit units for contolling the tone of a plurality of input audible sound signals and characterized in that a single variable resistor of a single thrown-multicontact type is used having each of its slidable contacts used separately as the slidable arm for different ones of said tone control circuit units.

16. The tone control arrangement as claimed in claim 12, wherein the multiplier comprises an audio amplifier section coupled to the passive circuit network; a d.c. amplifier section coupled to the variable d.c. voltage source; a multiplying section coupled to the audio and d.c. amplifier sections; and an output amplifier section coupled between the multiplying section and the first and second mixers.

17. The tone control arrangement as claimed in claim 12, wherein the multiplying section includes double, balanced type differential amplifiers.

* * * * *